(12) United States Patent
Chen et al.

(10) Patent No.: US 12,087,652 B2
(45) Date of Patent: *Sep. 10, 2024

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Yi Chen, Kaohsiung (TW); Chang-Lin Yeh, Kaohsiung (TW); Jen-Chieh Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/884,515

(22) Filed: Aug. 9, 2022

(65) Prior Publication Data

US 2022/0384289 A1 Dec. 1, 2022

Related U.S. Application Data

(63) Continuation of application No. 16/751,139, filed on Jan. 23, 2020, now Pat. No. 11,410,899, which is a
(Continued)

(51) Int. Cl.
*H01L 23/31* (2006.01)
*H01L 23/00* (2006.01)
(Continued)

(52) U.S. Cl.
CPC .......... *H01L 23/3114* (2013.01); *H01L 23/10* (2013.01); *H01L 23/49827* (2013.01); *H01L 23/49833* (2013.01); *H01L 23/66* (2013.01); *H01L 24/13* (2013.01); *H01L 24/73* (2013.01); *H01L 24/85* (2013.01); *H01Q 1/2283* (2013.01);
(Continued)

(58) Field of Classification Search
None
See application file for complete search history.

(56) References Cited

U.S. PATENT DOCUMENTS 9,620,464 B2 * 4/2017 Baks .................... H01Q 9/0457
10,580,713 B2 * 3/2020 Chen ....................... H01L 23/10
(Continued)

FOREIGN PATENT DOCUMENTS

CN 1871702 A 11/2006

OTHER PUBLICATIONS

Final Office Action for US Patent Application No. 16/751, 139, issued Dec. 10, 2021, 6 pages.
(Continued)

*Primary Examiner* — Long Pham
(74) *Attorney, Agent, or Firm* — FOLEY & LARDNER LLP

(57) ABSTRACT

A semiconductor package device includes a first substrate, a second substrate and a first spacer. The first substrate includes a first divided pad. The second substrate includes a second divided pad disposed above the first divided pad. The first spacer is disposed between the first divided pad and the second divided pad. The first spacer is in contact with the first divided pad and the second divided pad.

17 Claims, 19 Drawing Sheets

Related U.S. Application Data continuation of application No. 15/884,313, filed on Jan. 30, 2018, now Pat. No. 10,580,713.

(60) Provisional application No. 62/456,553, filed on Feb. 8, 2017.

(51) Int. Cl.

| | |
|---|---|
| *H01L 23/10* | (2006.01) |
| *H01L 23/498* | (2006.01) |
| *H01L 23/66* | (2006.01) |
| *H01Q 1/22* | (2006.01) |
| *H01Q 13/10* | (2006.01) |
| *H01Q 19/10* | (2006.01) |
| *H01Q 21/06* | (2006.01) |

(52) U.S. Cl.
CPC ........... *H01Q 1/2291* (2013.01); *H01Q 13/10* (2013.01); *H01Q 19/10* (2013.01); *H01Q 21/061* (2013.01); *H01L 23/49816* (2013.01); *H01L 23/49822* (2013.01); *H01L 24/16* (2013.01); *H01L 24/48* (2013.01); *H01L 2224/16225* (2013.01); *H01L 2224/48227* (2013.01); *H01L 2924/00014* (2013.01); *H01L 2924/14* (2013.01); *H01L 2924/15321* (2013.01)

(56) References Cited

U.S. PATENT DOCUMENTS

| | | | |
|---|---|---|---|
| 11,410,899 B2 * | 8/2022 | Chen | ............... H01L 24/85 |
| 2002/0017721 A1 | 2/2002 | Huang | |
| 2007/0200234 A1 | 8/2007 | Gerber et al. | |
| 2009/0246474 A1 | 10/2009 | Daisuke et al. | |
| 2009/0256752 A1 | 10/2009 | Akkermans et al. | |
| 2010/0327068 A1 * | 12/2010 | Chen | ............... H01Q 1/2283 |
| | | | 235/492 |
| 2011/0001250 A1 * | 1/2011 | Lin | ............... H01L 24/81 |
| | | | 427/97.1 |
| 2016/0049723 A1 * | 2/2016 | Baks | ............... H01Q 9/0457 |
| | | | 343/848 |

OTHER PUBLICATIONS

Final Office Action or U.S. Appl. No. 15/884,313, issued Jun. 10, 2019, 7 pages.

Non-Final Office Action for U.S. Appl. No. 15/884,313, issued Dec. 21, 2018, 9 pages.

Non-Final Office Action for U.S. Appl. No. 16/751,139, issued Aug. 2, 2021, 10 pages.

Notice of Allowance for U.S. Appl. No. 16/751,139, issued Apr. 5, 2022, 5 pages.

Notice of Allowance or U.S. Appl. No. 15/884,313, issued Oct. 23, 2019, 5 pages.

Office Action for corresponding Chinese Application No. 201810123078.0, issued on Nov. 3, 2020, 7 pages.

Search Report (with English translation) for corresponding Chinese Application No. 201810123078.0, issued on Nov. 3, 2020, 4 pages.

Office Action for corresponding Chinese Patent Application No. 202110824309.2, issued Jan. 9, 2024, 6 pages.

Search Report with English translation for corresponding CN Application No. 202110824309.2, issued Jan. 9, 2024, 4 pages.

Office Action for corresponding Chinese Patent Application No. 202110824309.2, issued Jul. 16, 2024, 7 pages.

Search Report with English translation for corresponding CN Application No. 202110824309.2, issued Jul. 16, 2024, 4 pages.

* cited by examiner

SEMICONDUCTOR PACKAGE DEVICE AND METHOD OF MANUFACTURING THE SAME

CROSS-REFERENCE TO RELATED APPLICATIONS

This application is a continuation of U.S. patent application Ser. No. 16/751,139 filed Jan. 23, 2020, now issued as U.S. Pat. No. 11,410,899, which is a continuation of U.S. patent application Ser. No. 15/884,313 filed Jan. 30, 2018, now issued as U.S. Pat. No. 10,580,713, which application claims the benefit of and priority to U.S. Provisional Application No. 62/456,553, filed Feb. 8, 2017, the contents of which are incorporated herein by reference in their entireties.

BACKGROUND

1. Technical Field

The present disclosure relates generally to a semiconductor package device and a method of manufacturing the same, and to a semiconductor package device including an antenna structure and a method of manufacturing the same.

2. Description of the Related Art

The development of mobile communication has caused demand for high data rates and stable communication quality, and high frequency wireless transmission (e.g., 28 GHz or 60 GHz) has become one of the most important topics in the mobile communication industry. In order to achieve such high frequency wireless transmission, the signal can be transmitted in a band having wavelengths from about ten to about one millimeter ("millimeter wave," or "mmWave"). However, the signal attenuation is one of the problems in millimeter wave transmission.

SUMMARY

In one or more embodiments, according to one aspect, a semiconductor package device includes a first substrate, a second substrate and a first spacer. The first substrate includes a first divided pad. The second substrate includes a second divided pad disposed above and facing toward the first divided pad. The first spacer is disposed between the first divided pad and the second divided pad. The first spacer is in contact with the first divided pad and the second divided pad.

In one or more embodiments, according to another aspect, a semiconductor package device includes a first substrate, a second substrate and at least two spacers. The first substrate includes a first pad. The second substrate includes a second pad disposed above and facing toward the first pad. At least two spacers are disposed between the first pad and the second pad.

In one or more embodiments, according to another aspect, a method of manufacturing a semiconductor package device includes (a) providing a first substrate, the first substrate including a first set of pads; (b) disposing a plurality of spacers on the first set of pads, wherein at least two of the spacers are disposed on a first pad of the first set of pads; and (c) disposing a second substrate on the first substrate, the second substrate including a second set of pads respectively disposed above the first set of pads, wherein a second pad of the second set of pads is disposed on the at least two of the spacers.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
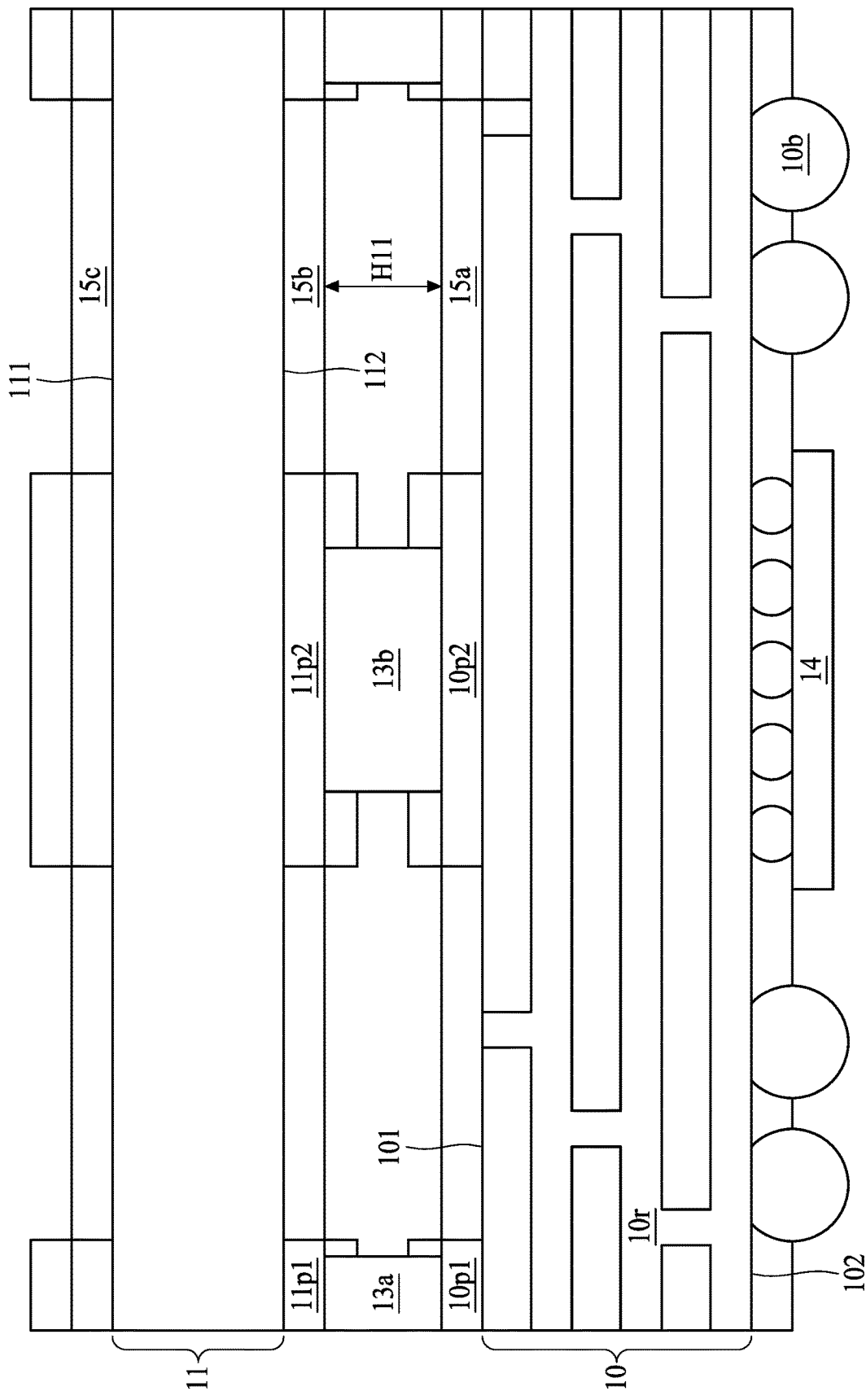
FIG. 1 illustrates a cross-sectional view of a semiconductor package device in accordance with some embodiments of the present disclosure.

FIG. 1 illustrates a cross-sectional view of a semiconductor package device 1 in accordance with some embodiments of the present disclosure. The semiconductor package device 1 includes substrates 10, 11, support structures 13a, 13b, an electronic component 14, and antenna patterns 15a, 15b, 15c.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10r, such as a redistribution layer (RDL) or a grounding element. In some embodiments, the substrate 10 may be a single-layer substrate or multi-layer substrate which includes a core layer and a conductive material and/or structure disposed on an upper surface and a bottom surface of the substrate 10. The conductive material and/or structure may include a plurality of traces.

Figure 2:
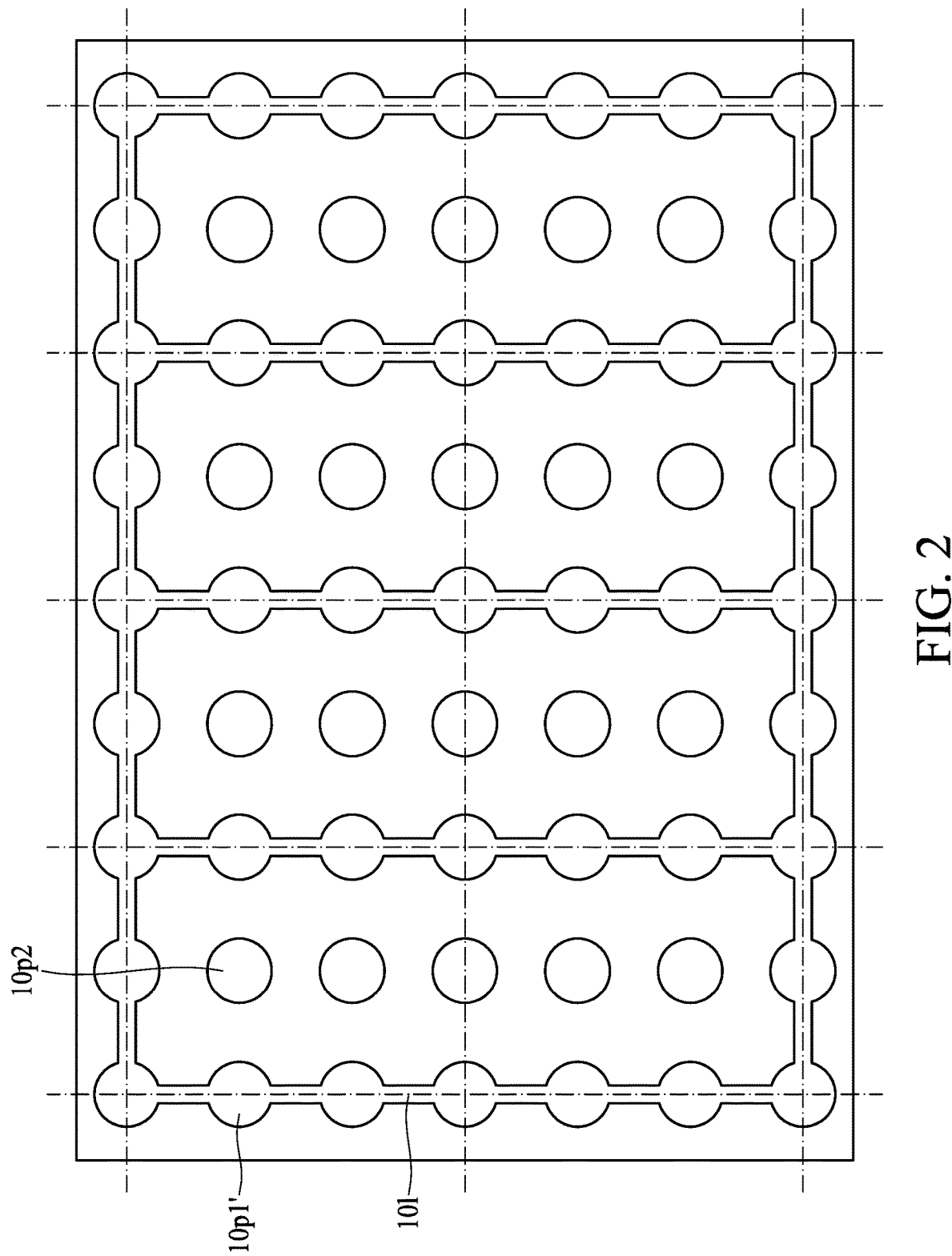
FIG. 2 illustrates a top view of a substrate strip including a substrate shown in FIG. 1 in accordance with some embodiments of the present disclosure.

In some embodiments, a surface 101 of the substrate 10 is referred to as a top surface or a first surface and a surface 102 of the substrate 10 is referred to as a bottom surface or a second surface. In some embodiments, the substrate 10 may include a plurality of conductive pads (e.g., 10$p$1, 10$p$2) or solder bumps 10$b$ on its first surface 101 and/or second surface 102. In some embodiments, the conductive pads include a divided conductive pad 10$p$1 and a non-divided conductive pad 10$p$2. For example, as shown in FIG. 2, which illustrates a top view of a substrate strip including the substrate 10 before a singulation process, the divided conductive pad 10$p$1 is formed after the singulation process to cut through a conductive pad 10$p$1' that is located at a scribe line (or cut line) 101. In addition, as shown in FIG. 2, the non-divided conductive pad 10$p$2 is not located at the scribe line during the singulation process, and thus the non-divided conductive pad 10$p$2 has not been divided. In one or more embodiments, the divided conductive pad 10$p$1 may be about 0.9 or less, about 0.8 or less, about 0.7 or less, about 0.6 or less, or about 0.5 or less times as wide as is the non-divided conductive pad 10$p$2.

The antenna pattern 15$a$ is disposed on the first surface 101 of the substrate 10. In some embodiments, the antenna pattern 15$a$ includes a plurality of antenna elements. For example, the antenna pattern 15$a$ may include an array of antenna elements. In some embodiments, the antenna 15$a$ may include an N×N array of antenna elements, where N is an integer greater than 1.

The electronic component 14 is disposed on the second surface 102 of the substrate. In some embodiments, the electronic component 14 is electrically connected to the antenna pattern 15$a$ through the interconnection structure 10$r$ within the substrate 10. The electronic component 14 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The electronic component 14 may be electrically connected to the substrate 10 (e.g., to the conductive pads), and electrical connection may be attained by way of flip-chip or wire-bond techniques.

The substrate 11 is disposed over the substrate 10 and spaced apart from the substrate 10. In some embodiments, the substrate 11 can be the same as or different from the substrate 10 depending on design specifications. In some embodiments, a surface 111 of the substrate 11 is referred to as a top surface or a first surface and a surface 112 of the substrate 11 is referred to as a bottom surface or a second surface. In some embodiments, the substrate 11 may include a plurality of conductive pads (e.g., 11$p$1, 11$p$2) on its first surface 111 and/or second surface 112. In some embodiments, similar to the conductive pads 10$p$1, 10$p$2 of the substrate 10, the substrate 11 includes a divided conductive pad 11$p$1 and a non-divided conductive pad 11$p$2. The divided conductive pad 11$p$1 is disposed corresponding to (e.g. above) the divided conductive pad 10$p$1, and the non-divided conductive pad 11$p$2 is disposed corresponding to (e.g. above) the non-divided conductive pad 10$p$2. For example, the divided conductive pad 11$p$1 may be aligned with the divided conductive pad 11$p$1 and the non-divided conductive pad 10$p$2 may be aligned with the non-divided conductive pad 11$p$2. In one or more embodiments, the divided conductive pad 11$p$1 may be about 0.9 or less, about 0.8 or less, about 0.7 or less, about 0.6 or less, or about 0.5 or less times as wide as is the non-divided conductive pad 11$p$2.

The support structures 13$a$, 13$b$ are disposed between the substrate 10 and the substrate 11 to separate the substrate 10 and the substrate 11 and define a cavity (e.g. an air cavity) or cavities there between. In some embodiments, the support structure 13$a$ is disposed between the divided conductive pads 10$p$1 and 11$p$1 and in contact with the divided conductive pads 10$p$1 and 11$p$1. The support structure 13$b$ is disposed between the non-divided conductive pads 10$p$2 and 11$p$2 and in contact with the non-divided conductive pads 10$p$2 and 11$p$2.

The antenna pattern 15$c$ is disposed on the first surface 111 of the substrate 11. The antenna pattern 15$b$ is disposed on the second surface 112 of the substrate 11 corresponding to (e.g. disposed above) the antenna pattern 15$a$ disposed on the first surface 101 of the substrate 10. For example, the antenna pattern 15$b$ faces toward the antenna pattern 15$a$. For example, the antenna pattern 15$b$ may be aligned with the antenna pattern 15$a$. In some embodiments, the antenna pattern 15$b$ or 15$c$ includes a plurality of antenna elements. For example, the antenna pattern 15$b$ or 15$c$ may include an array of antenna elements. In some embodiments, the antenna pattern 15$b$ or 15$c$ may include an N×N array of antenna elements, where N is an integer greater than 1. In some embodiments, one of the antenna pattern 15$b$ and the antenna pattern 15$c$ can be omitted depending on design specifications.

As shown in FIG. 1, since the support structures 13$a$, 13$b$ are disposed between the substrates 10 and 11 to define an air cavity, a gain, bandwidth and radiation efficiency of the antenna patterns 15$a$, 15$b$ and 15$c$ can be improved by promoting resonance between the antenna pattern 15$a$ and the antenna pattern 15$b$. To attain a desired level of resonance, a height H11 of the air cavity (e.g. a distance between the antenna pattern 15$a$ and the antenna pattern 15$b$) and a tolerance of the height H11 can be controlled within a certain range. For example, the height H11 of the air cavity can be 250 micrometers (μm) with a tolerance about ±25 μm, or of ±about 22 μm, or of ±about 19 μm.

In some comparative implementations, the support structures 13$a$, 13$b$ can be implemented by solder (e.g. by using solder bumps). However, the dimension of the solder bumps (e.g. a height) may decrease after every reflow process. Therefore, it can be difficult to control the size of each solder bump after the reflow processes, and to control the uniformity of all the solder bumps (which can be desirable). Therefore, a large tolerance may exist for the solder bumps. For example, it may be desirable to have a height of the solder bumps correspond to the height H11, and the above-described issues may yield a range of variation greater than a desired range of variation (such as ±about 30 μm or greater), which can decrease the efficiency of the resonance of the antenna patterns.

In some comparative implementations, the support structures 13$a$, 13$b$ can be implemented by spacers. For example, a spacer is disposed between a conductive pad of the substrate 10 and a corresponding conductive pad of the substrate 11. However, a spacer may be divided into many pieces (e.g., two or four pieces) after a singulation process if the spacer is disposed on the conductive pad that is located at the scribe line 101 as shown in FIG. 2. Since the divided spacer can have a relatively weak strength, it may be unable to provide a stable support between the substrates 10 and 11, which can be helpful in controlling the distance between the substrates 10 and 11 (e.g., controlling the height H11 of the air cavity). Further, in some embodiments, due to variations of the singulation process, the divided spacer may not be in contact with the substrate 10 and/or 11, which may affect the function of the spacer to provide a support between the substrates 10 and 11.

Figure 3A:
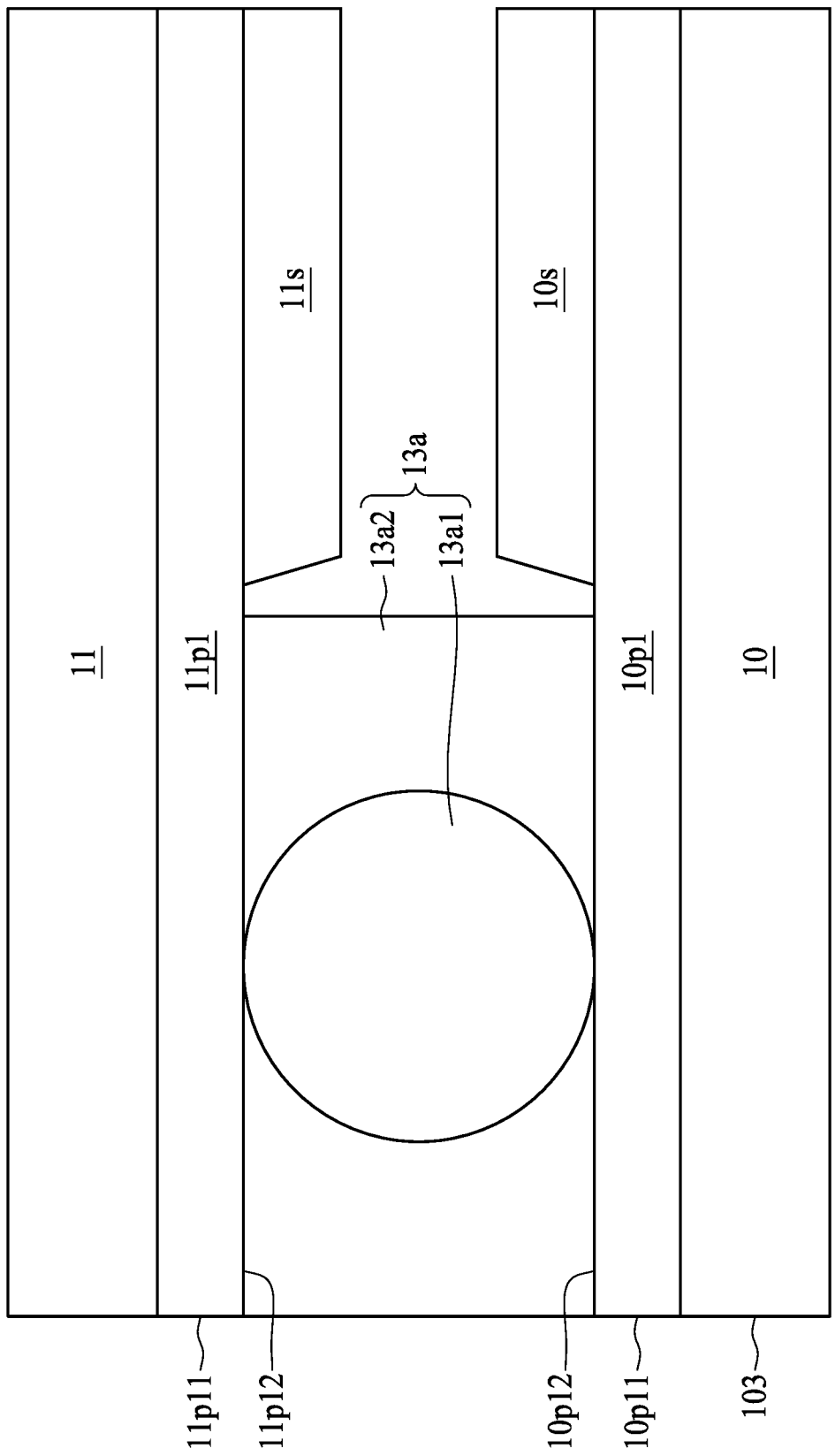
FIG. 3A illustrates a cross-sectional view of a support structure in FIG. 1 in accordance with some embodiments of the present disclosure.

FIG. 3A illustrates a cross-sectional view of the support structure 13a in FIG. 1 in accordance with some embodiments of the present disclosure. The support structure 13a includes a spacer 13a1 and an adhesive layer 13a2 covering at least a portion of the spacer 13a1. Insulating layers 10s and 11s are also provided. The spacer 13a1 is disposed between the divided conductive pads 10p1 and 11p1 and in contact with a portion of the divided conductive pad 10p1 and a portion of the divided conductive pad 11p1 that is not covered by the insulating layers 10s and 11s. For example, a distance between the divided pads 10p1 and 11p1 is substantially equal to a height of the spacer 13a1. The adhesive layer 13a2 is disposed between the divided conductive pads 10p1 and 11p1 and in contact with the divided conductive pads 10p1 and 11p1. The adhesive layer 13a2 covers a portion of the spacer 13a1 that is not in contact with the divided pads 10p1 and 11p1. In some embodiments, the adhesive layer 13a2 includes solder and/or copper paste. In some embodiments, the spacer 13a1 includes a copper-cored ball or bump and/or a polymer ball or bump. In some embodiments, a material of the spacer 13a1 is chosen so that a melting point of the spacer 13a1 is higher than a temperature of a reflow process for the spacer 13a1.

In some embodiments, a roughness of a surface 10p11 (also referred to as "lateral surface") of the divided conductive pad 10p1 is different from that of a surface 10p12 (also referred to as "top surface") of the divided conductive pad 10p1. The lateral surface 10p11 of the divided conductive pad 10p1 may be substantially perpendicular to the top surface 10p12 of the divided conductive pad 10p1. For example, the roughness of the lateral surface 10p11 of the divided conductive pad 10p1 may be about 1.3 times or greater, about 1.5 times or greater, or about 1.8 times or greater than the roughness of the top surface 10p12 of the divided conductive pad 10p1. In some embodiments, the surface 10p11 of the divided conductive pad 10p1 is substantially coplanar with a lateral surface 103 of the substrate 10. In some embodiments, a roughness of a surface 11p11 (also referred to as "lateral surface") of the divided conductive pad 11p1 is different from that of a surface 11p12 (also referred to as "bottom surface") of the divided conductive pad 11p1. The lateral surface 11p11 of the divided conductive pad 11p1 may be substantially perpendicular to the top surface 11p12 of the divided conductive pad 11p1. For example, the roughness of the lateral surface 11p11 of the divided conductive pad 11p1 may be about 1.3 times or greater, about 1.5 times or greater, or about 1.8 times or greater than the roughness of the top surface 11p12 of the divided conductive pad 11p1. In some embodiments, the surface 11p11 of the divided conductive pad 11p1 is substantially coplanar with a lateral surface of the substrate 11.

Figure 3B:
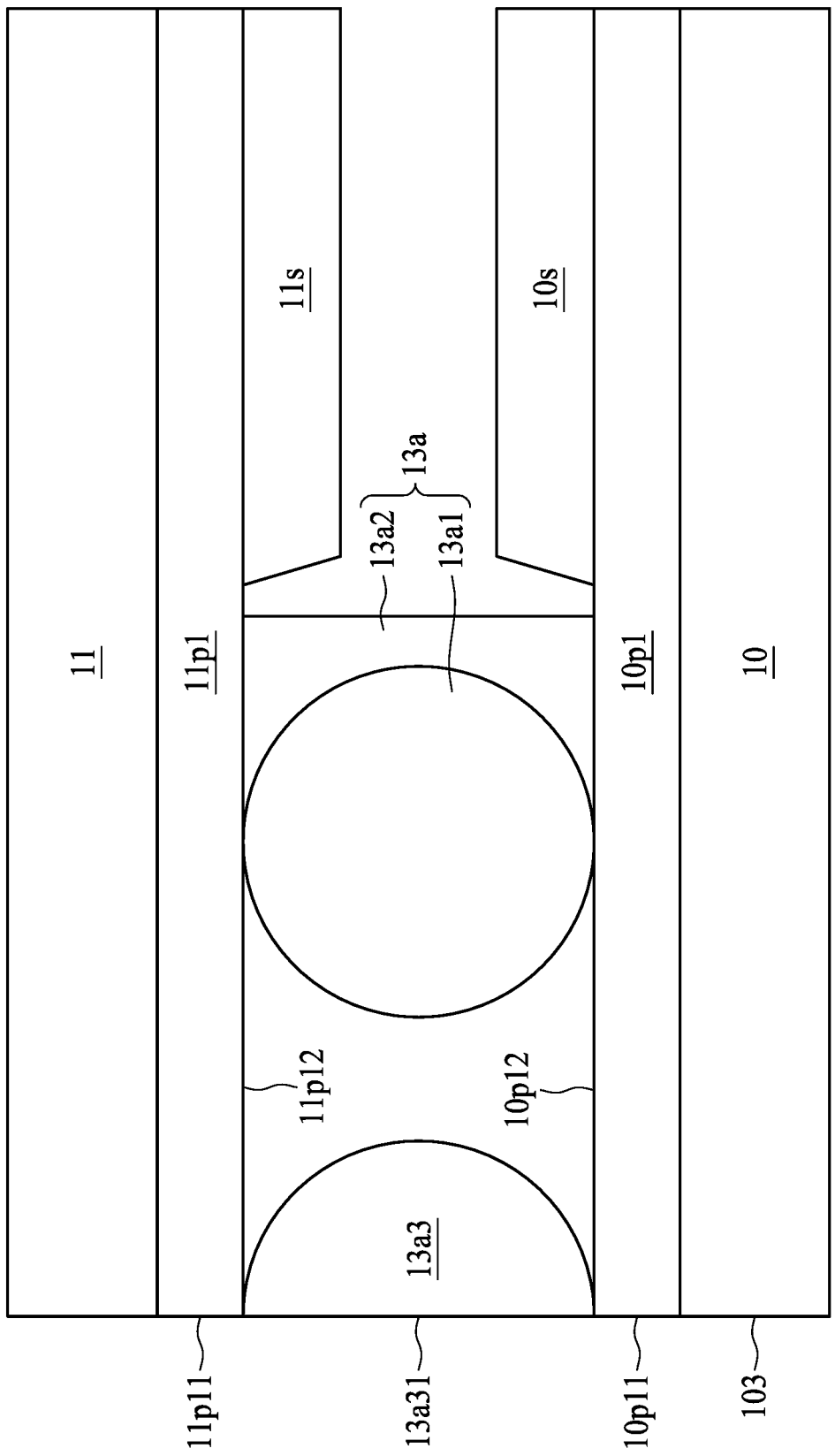
FIG. 3B illustrates a cross-sectional view of the support structure in FIG. 1 in accordance with some embodiments of the present disclosure.

In some embodiments, the support structure 13a may include more than one spacer. For example, the support structure 13a may include N spacers, where N is greater than 1. In some embodiments, as shown in FIG. 3B, the support structure 13a may include at least one spacer 13a1 that has not been divided during a singulation process and a divided spacer 13a3. A width of the divided spacer 13a3 may be, for example, about 0.9 or less, about 0.8 or less, about 0.7 or less, about 0.6 or less, or about 0.5 or less times that of the spacer 13a1. For example, a portion of the divided spacer 13a3 is removed. In some embodiments, a lateral, divided surface 13a31 of the divided spacer 13a3 is substantially coplanar with the lateral surfaces 10p11 and 11p11 of the divided conductive pads 10p1 and 11p1. By disposing at least one entire spacer (e.g., non-divided spacer or a spacer that has not been divided during the singulation process) between two corresponding divided conductive pads (e.g., the divided conductive pads 10p1 and 11p1), the support structure 13a between the substrates 10 and 11 can be reinforced, so as to precisely control a distance between the substrates 10 and 11.

Figure 4:
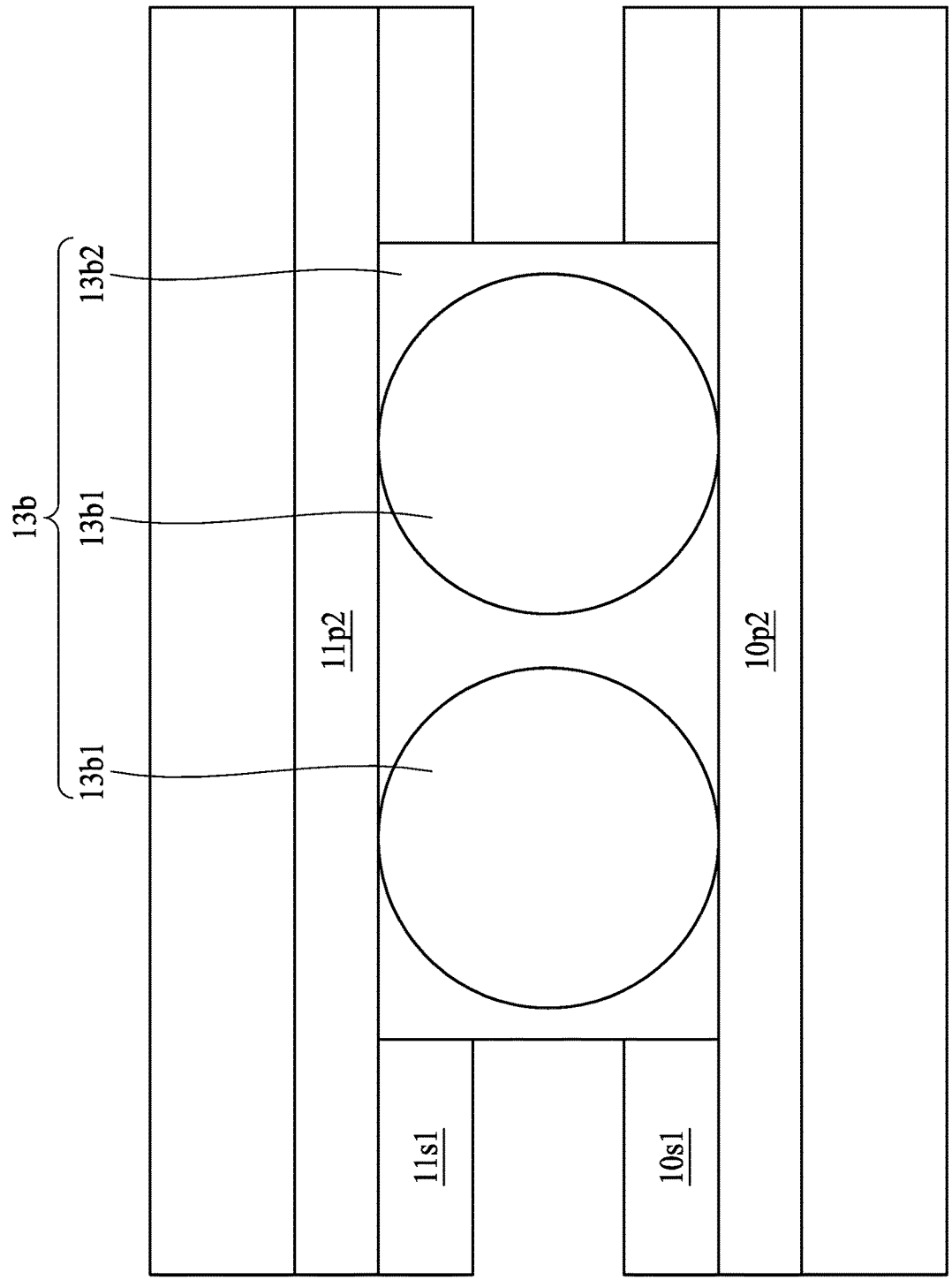
FIG. 4 illustrates a cross-sectional view of the support structure in FIG. 1 in accordance with some embodiments of the present disclosure.

FIG. 4 illustrates a cross-sectional view of the support structure 13b in FIG. 1 in accordance with some embodiments of the present disclosure. The support structure 13b includes one or more spacers 13b1 and an adhesive layer 13b2 covering at least a portion of the spacers 13b1. Insulating layers 10s1 and 11s1 are also provided. The spacers 13b1 are disposed between the non-divided conductive pads 10p2 and 11p2 and in contact with a portion of the non-divided conductive pad 10p2 and a portion of the non-divided conductive pad 11p2 that is not covered by the insulating layers 10s1 and 11s1. For example, a distance between the non-divided pads 10p2 and 11p2 is substantially equal to a height of each of the spacers 13b1. The adhesive layer 13b2 is disposed between the non-divided conductive pads 10p2 and 11p2 and in contact with the non-divided conductive pads 10p2 and 11p2. The adhesive layer 13b2 covers a portion of the spacers 13b1 that is not in contact with the non-divided pads 10p2 and 11p2. In some embodiments, the adhesive layer 13b2 includes solder and/or copper paste. In some embodiments, the spacers 13b1 include a copper-cored ball or bump and/or a polymer ball or bump. In some embodiments, the material of the spacers 13b1 is chosen so that a melting point of the spacers 13b1 is higher than a temperature of a reflow process for the spacers 13b1.

FIG. 5A, FIG. 5B, FIG. 5C, FIG. 5D and FIG. 5E are cross-sectional views of a semiconductor structure at various stages of fabrication, in accordance with some embodiments of the present disclosure. Various figures have been simplified to provide a better understanding of the aspects of the present disclosure. In some embodiments, the structures shown in FIG. 5A, FIG. 5B, FIG. 5C, FIG. 5D and FIG. 5E are used to manufacture the support structures 13a, 13b shown in FIG. 1, FIG. 3A and FIG. 3B.

Figure 5A:
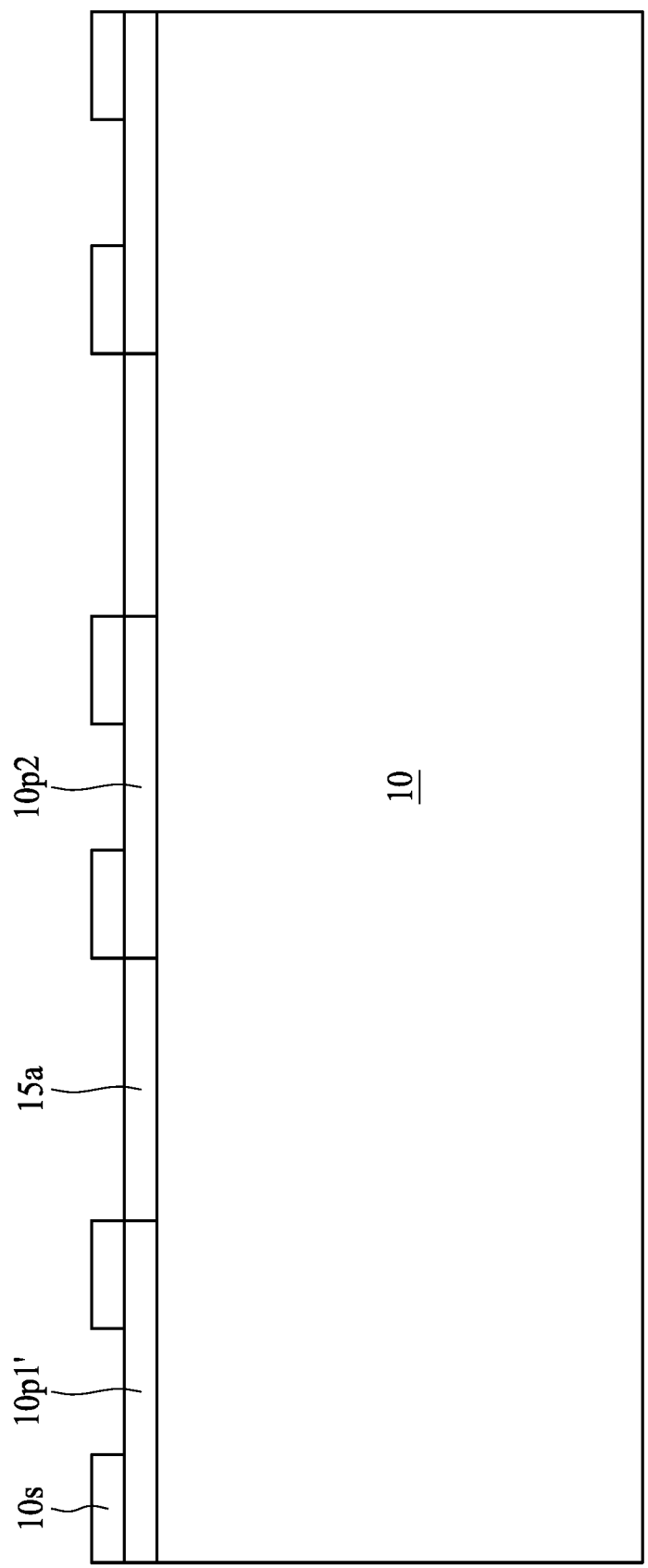
FIG. 5A, FIG. 5B, FIG. 5C, FIG. 5D and FIG. 5E illustrate a method of manufacturing a semiconductor package device in accordance with some embodiments of the present disclosure.

Referring to FIG. 5A, a substrate 10 having an antenna pattern 15a and conductive pads 10p1' and 10p2 is provided. The substrate 10 includes an insulation layer 10s (e.g., a solder mask) covering a portion of the conductive pads 10p1' and 10p2. As shown in FIG. 5A, one or more recesses are defined by the insulation layer 10s and the conductive pads 10p1' and 10p2.

Figure 5B:
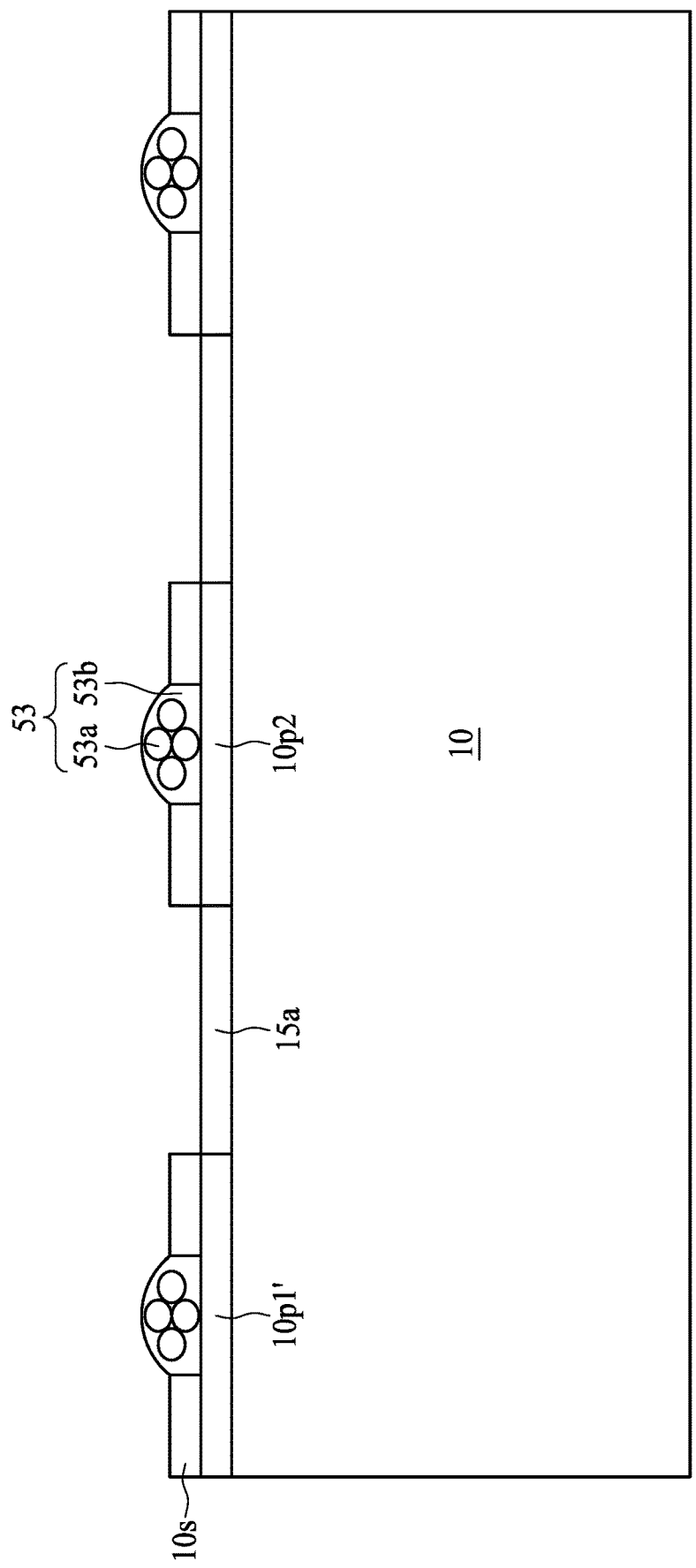

Referring to FIG. 5B, a paste 53 (or soldering paste) is formed within the one or more recesses defined by the insulation layer 10s and the conductive pads 10p1' and 10p2. In some embodiments, the paste 53 includes a plurality of spacers 53a and an adhesive layer 53b covering the spacers 53a. In some embodiments, a total volume of the spacers 53a is more than about 2% of a volume of the paste 53 (e.g. about 3% or more of the volume of the paste 53, about 4% or more of the volume of the paste 53, or about 5% or more of the volume of the paste 53), and a total volume of the adhesive layer 53b is less than about 98% of the volume of the paste 53 (e.g. about 97% or less of the volume of the paste 53, about 96% or less of the volume of the paste 53, or about 95% or less of the volume of the paste 53).

Figure 5C:
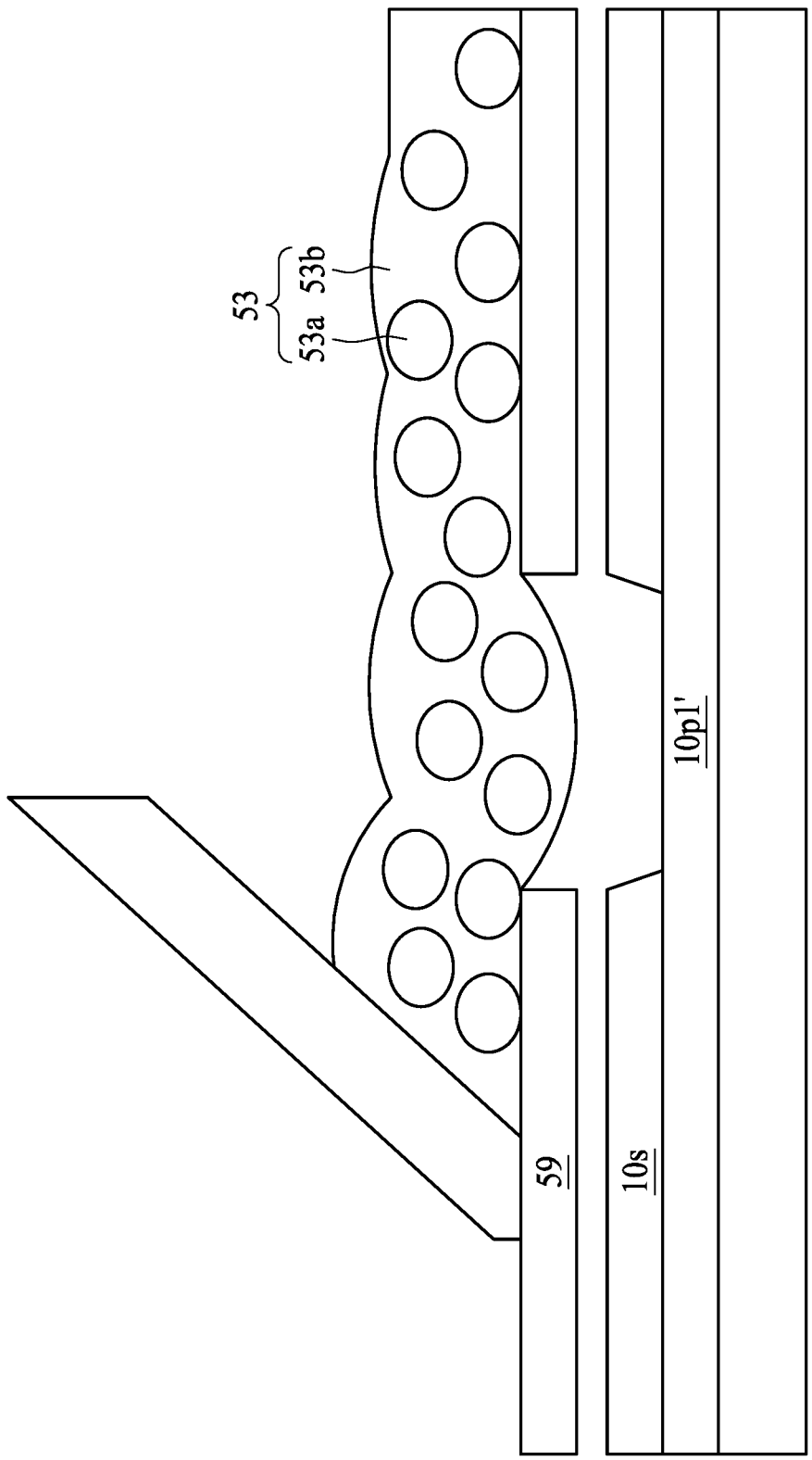

In some embodiments, the paste 53 can be formed by printing process. For example, as shown in FIG. 5C, a stencil 59 is disposed on the insulation layer 10s. The stencil 59 defines an opening corresponding to at least one of the one or more recesses defined by the insulation layer 10s and the conductive pads 10p1' and 10p2. A size (e.g. a width) of each of the spacers 53a is less than a diameter of the opening of the stencil 59 (e.g. a ratio of the diameter of the opening of the stencil 59 to a diameter of each respective spacer 53a is at least equal to or greater than about 6.8 times the size of each spacer 53a, such as about 7.8 or more times larger than the size of each spacer 53a, about 9.8 or more times larger than the size of each spacer 53a, or greater), and is less than a diameter of the one or more recesses defined by the insulation layer 10s and the conductive pads 10p1' and 10p2 (e.g. the size of each of the spacers 53a is less than about 0.5 times the diameter of the one or more recesses defined by the insulation layer 10s and the conductive pads 10p1' and 10p2, less than about 0.4 times the diameter of the one or more recesses defined by the insulation layer 10s and the conductive pads 10p1' and 10p2, or less than about 0.3 times the diameter of the one or more recesses defined by the insulation layer 10s and the conductive pads 10p1' and 10p2), and each recess may accommodate a plurality of spacers 53a.

Figure 5D:
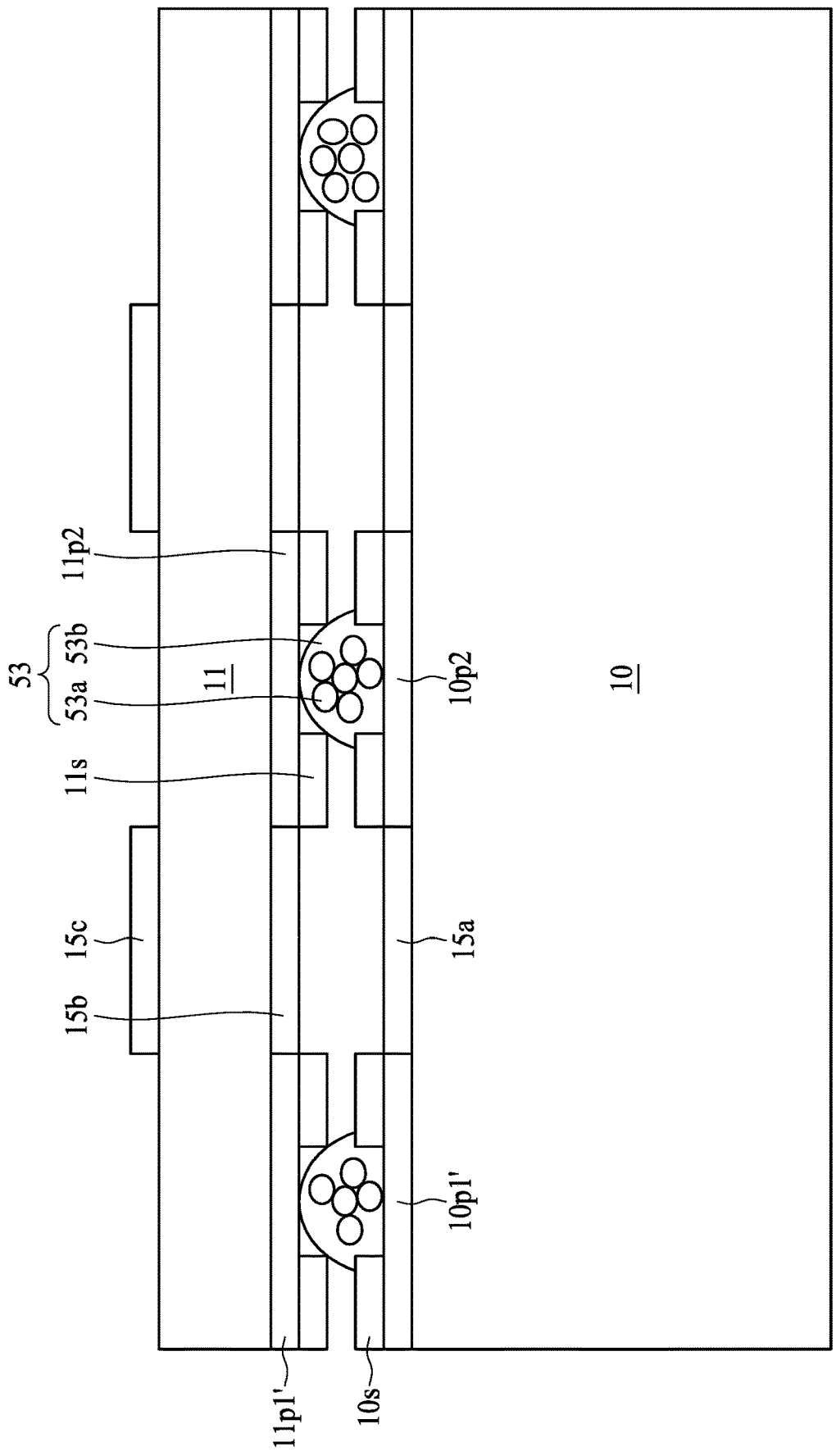

Referring to FIG. 5D, a substrate 11 is disposed over the substrate 10 and in contact with the paste 53. The substrate 11 includes antenna patterns 15b and 15c corresponding to the antenna pattern 15a. The substrate 11 has conductive pads 11p1' and 11p2 corresponding to the conductive pads 10p1' and 10p2. The paste 53 is in contact with a portion of the conductive pads 11p1' and 11p2 that is not covered by the insulation layer 11s. Then, the paste 53 is heated to form the support structure 13 as shown in FIG. 1. For example, the spacers 53a, the adhesive layer 53b, the substrates 10, 11 and the conductive pads 10p1', 10p2, 11p1' and 11p2 are cured.

Figure 5E:
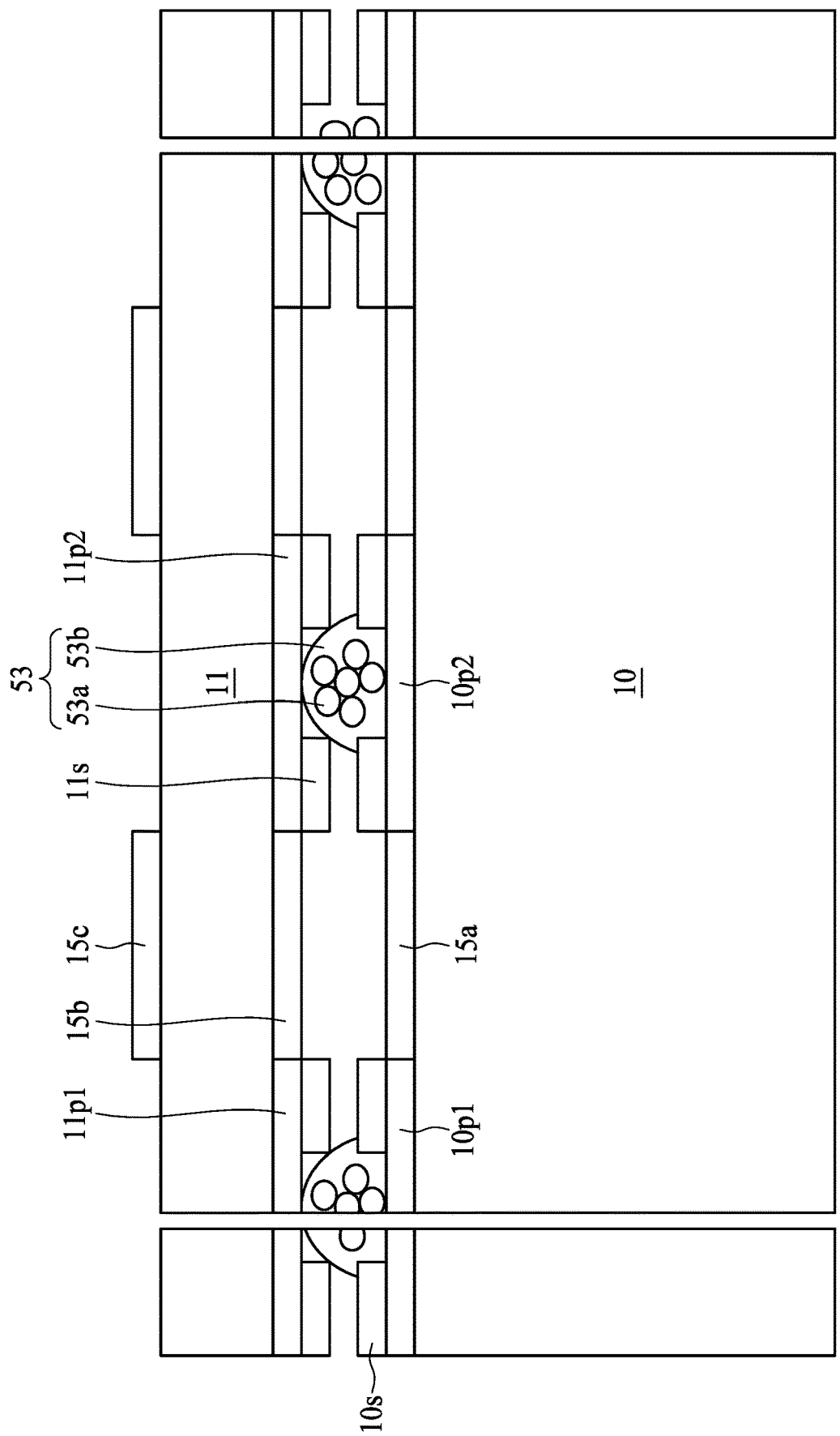

Referring to FIG. 5E, a singulation process is carried out to separate out individual semiconductor package devices. That is, the singulation is performed through a substrate strip including the substrates 10, 11. The singulation is also performed through the conductive pads 10p1' and 11p1' to form divided conductive pads 10p1 and 11p1. The singulation may be performed, for example, by using a dicing saw, laser or other appropriate cutting technique.

Figure 6:
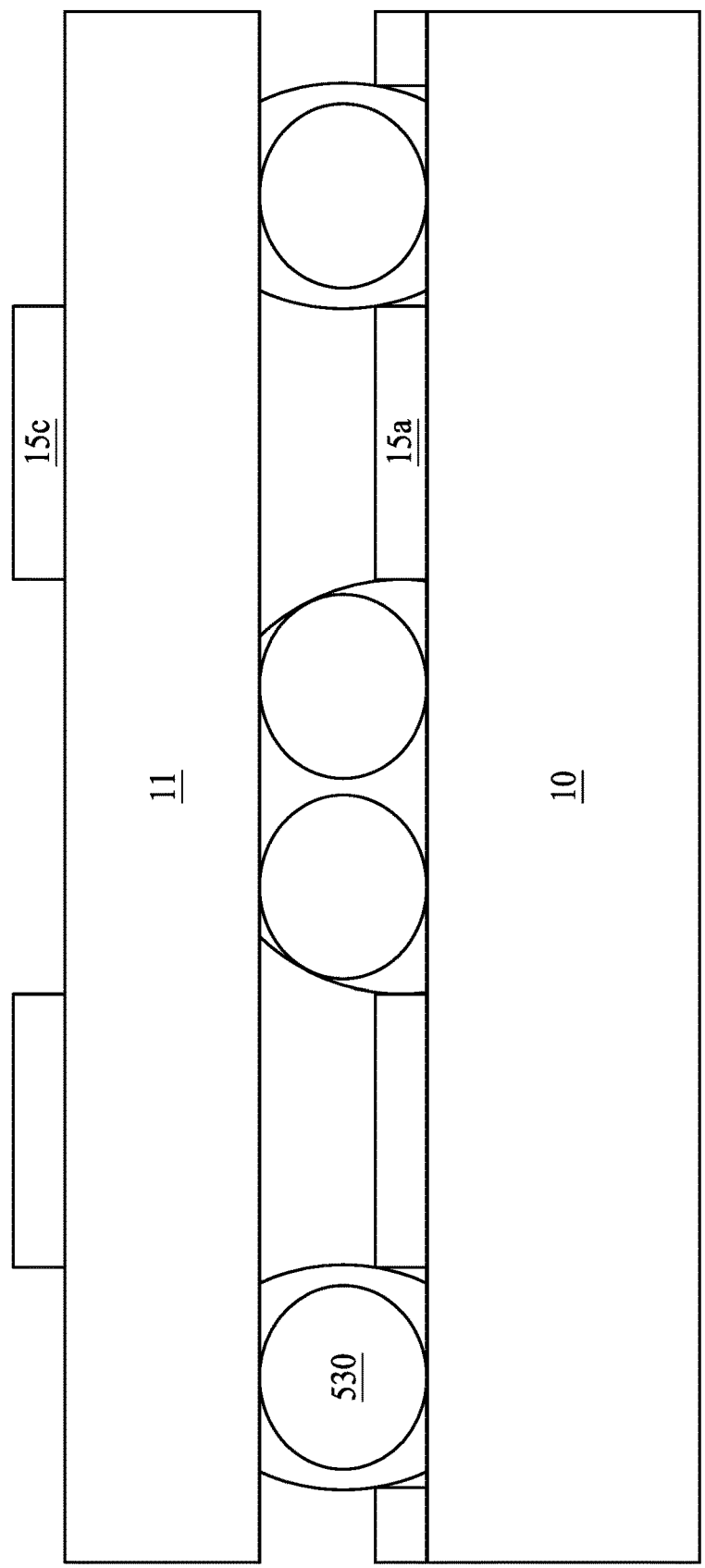
FIG. 6 illustrates a cross-sectional view of a semiconductor package device in accordance with some embodiments of the present disclosure.

FIG. 6 shows a semiconductor package device 6 according to some embodiments of the present disclosure. The semiconductor package device 6 includes a substrate 10, an antenna pattern 15a disposed on the substrate 10, a substrate 11, an antenna layer 15c disposed on the substrate 11, and a stand-off (or other support) structure 530 disposed between the substrate 10 and the substrate 11 to define an air cavity therebetween. In some embodiments, the stand-off structure 530 includes an array of polymer spacers along with an adhesive (e.g., an epoxy resin or other resin) to provide adhesion to the substrate 10 and the substrate 11. Advantages of the semiconductor package device 6 include a well-controlled air cavity height, such as where a height of the polymer spacers can be controlled to 250 µm±10 µm (e.g. to 250 µm±8 µm, or 250 µm±6 µm), and high-throughput placement of the polymer spacers and the adhesive by a dispensing process. The polymer spacers and the adhesive are disposed in gaps between regions of the antenna pattern 15a, and cross-sectional widths of the polymer spacers and the adhesive vary according to different widths of the gaps. In some embodiment, the semiconductor package device 6 further includes an adhesive material formed on the substrate 10 around the polymer spacers.

In some embodiments, the stand-off structure 530 may include an array of polymer spacers along with a die attach film (DAF) to provide adhesion to the substrate 10 and the substrate 11. Advantages of the use of the DAF as the stand-off structure 530 include a well-controlled air cavity height, such as where a height of the polymer spacers can be controlled to 250 µm±10 µm (e.g. to 250 µm±8 µm, or 250 µm±6 µm), and a low degree of bleeding of a material of the DAF to mitigate against contamination of the antenna pattern 15a. The polymer spacers and the DAF are disposed in gaps between regions of the antenna pattern 15a, and cross-sectional widths of the polymer spacers and the DAF varies according to different widths of the gaps.

In some embodiments, the stand-off structure 530 may include an array of polymer cores surrounded by a solder to provide adhesion to the substrate 10 and the substrate 11. Advantages of the use of the polymer cores surrounded by the solder include a well-controlled air cavity height, such as where a height of the polymer cores can be controlled to 250 µm±10 µm (e.g. to 250 µm±8 µm, or 250 µm±6 µm), and high-throughput placement of the polymer cores and the solder by a ball or bump mounting process. The polymer cores and the solder are disposed in gaps between regions of the antenna pattern 15a, and cross-sectional widths of the polymer cores and the solder vary according to different widths of the gaps.

In some embodiments, the stand-off structure 530 may include an array of conductive posts (e.g., copper (Cu) pillars) and a solder to provide adhesion. Advantages of the use of the conductive posts include a well-controlled air cavity height, such as where a height of the conductive posts can be controlled to 250 µm±10 µm (e.g. to 250 µm±8 µm, or 250 µm±6 µm), and high-throughput manufacturing by a solder paste printing process. The conductive posts are disposed in gaps between regions of the antenna pattern 15a, and cross-sectional widths of the conductive posts vary according to different widths of the gaps.

Figure 7:
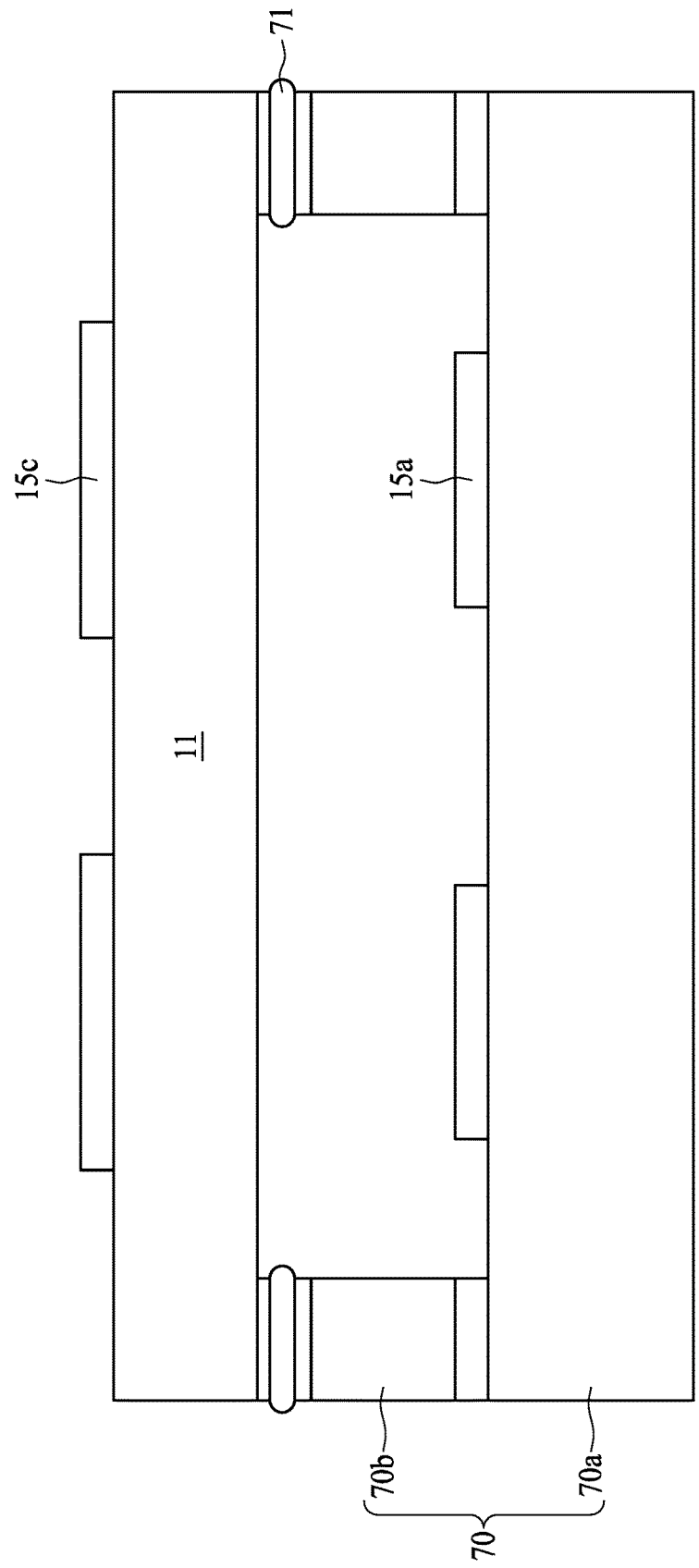
FIG. 7 illustrates a cross-sectional view of a semiconductor package device in accordance with some embodiments of the present disclosure.

FIG. 7 illustrates a semiconductor package device 7 according to some embodiments of the present disclosure. The semiconductor package device 7 includes a substrate 70 including a base portion 70a and an extension portion 70b protruding upwardly from the base portion 70a, an antenna pattern 15a disposed on the substrate 10, a substrate 11 disposed on the extension portion 70b of the substrate 70 via a solder paste 71 to define an air cavity between the substrate 70 and the substrate 11, and an antenna layer 15c disposed on the substrate 11. Advantages of the semiconductor package device 7 include a well-controlled air cavity height, such as where the height of the cavity can be controlled to 250 µm±10 µm (e.g. to 250 µm±8 µm, or 250 µm±6 µm), and a low degree of bleeding of a material of the extension portion to mitigate against contamination of the antenna pattern 15a. In some embodiments, the semiconductor package device 7 further includes an adhesive material formed on the substrate 70 around the extension portion 70b of the substrate 70.

Figure 8A:
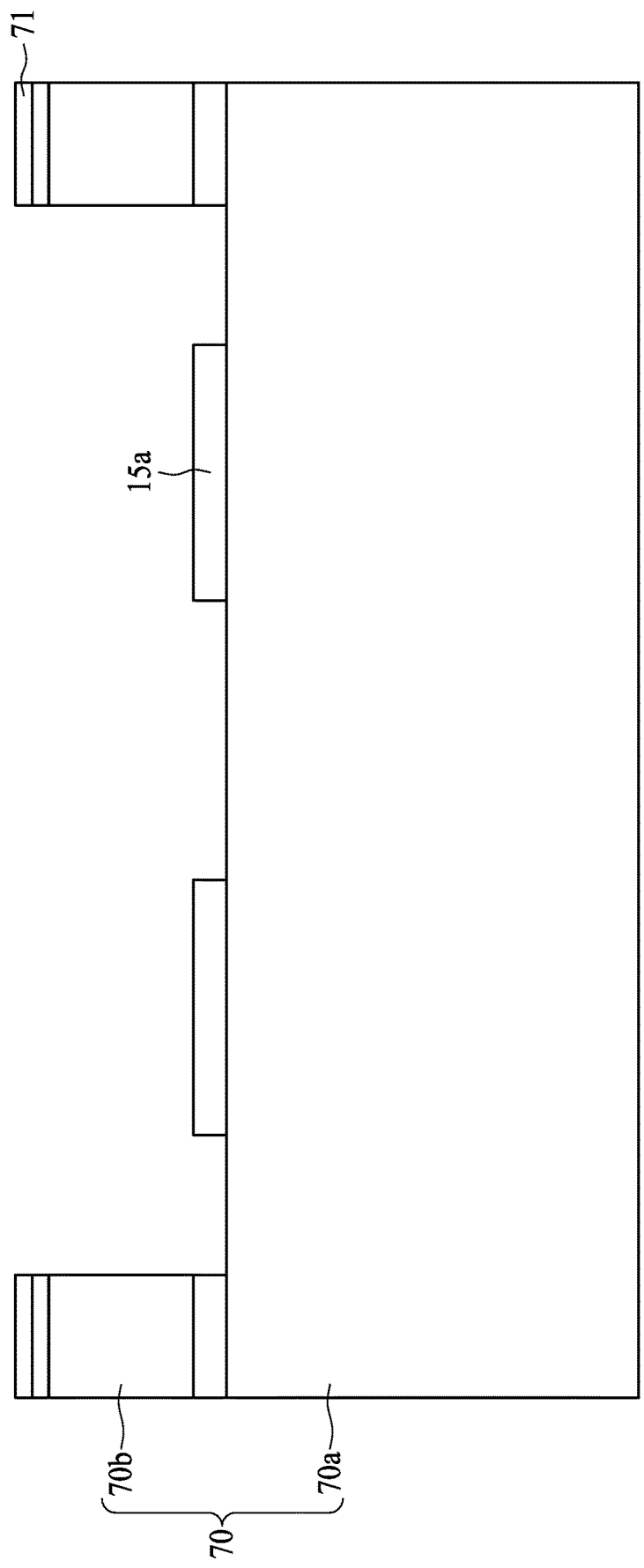
FIG. 8A and FIG. 8B illustrate a method of manufacturing a semiconductor package device in accordance with some embodiments of the present disclosure.
Figure 8B:
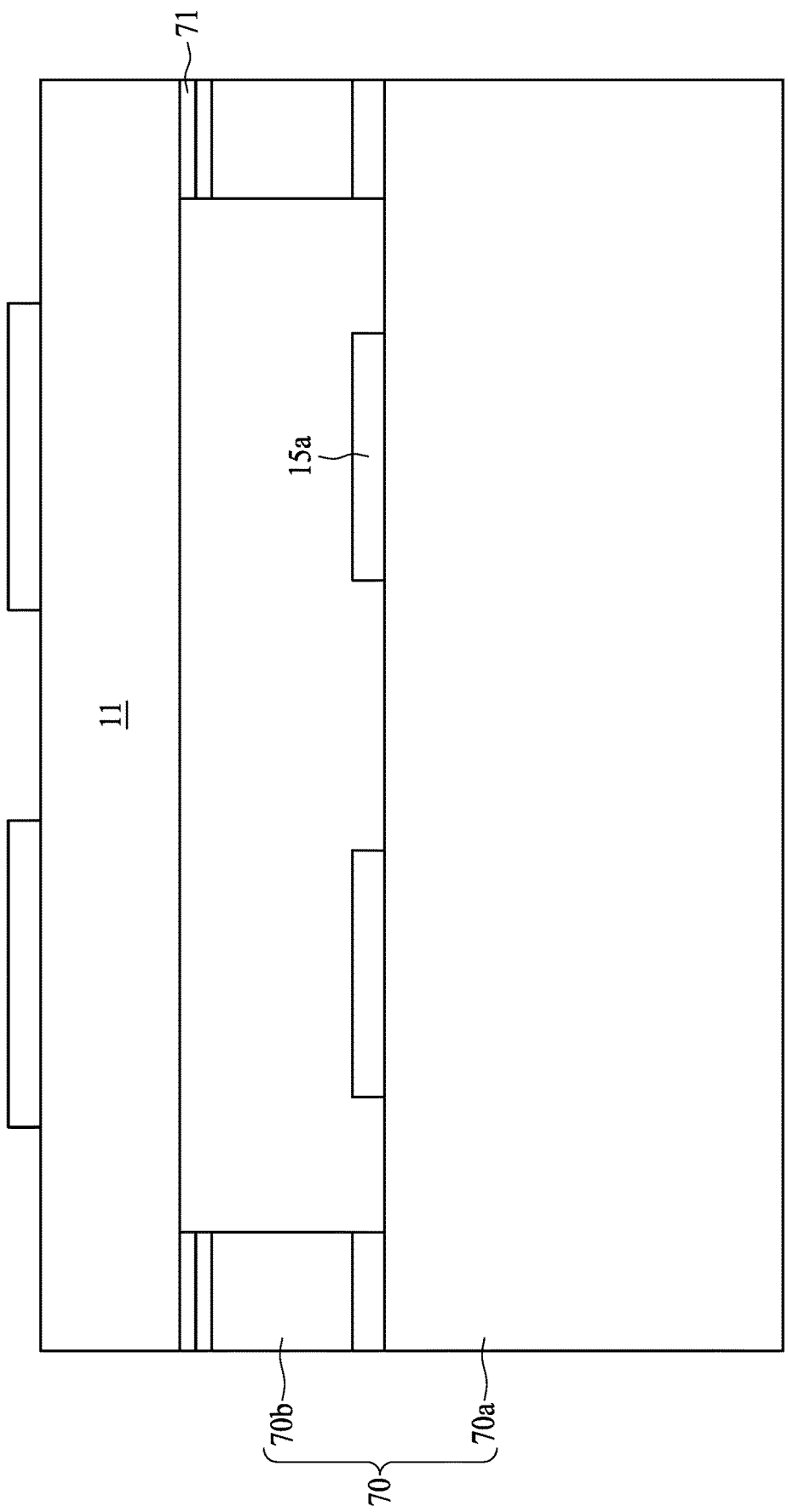

FIG. 8A and FIG. 8B are cross-sectional views of a semiconductor structure at various stages of fabrication, in accordance with some embodiments of the present disclosure. Various figures have been simplified to provide a better understanding of the aspects of the present disclosure. In some embodiments, the structures shown in FIG. 8A and FIG. 8B are used to manufacture the semiconductor package device 7 shown in FIG. 7.

Referring to FIG. 8A, the substrate 70 including the base portion 70a and the extension portion 70b protruding upwardly from the base portion 70a. The antenna pattern 15a is formed on the substrate 10. A printing process is performed on the extension portion 70b of the substrate 70 to apply the solder paste 71.

Referring to FIG. 8B, the substrate 11 (e.g. already singulated) is disposed on the extension portion 70b of the substrate 70 by a pick and place tool, and a solder reflow process is performed to form the semiconductor package device 7 shown in FIG. 7. Although the cavity is shown as being formed in the substrate 70, in other embodiments the cavity can be formed in the substrate 11.

Figure 9:
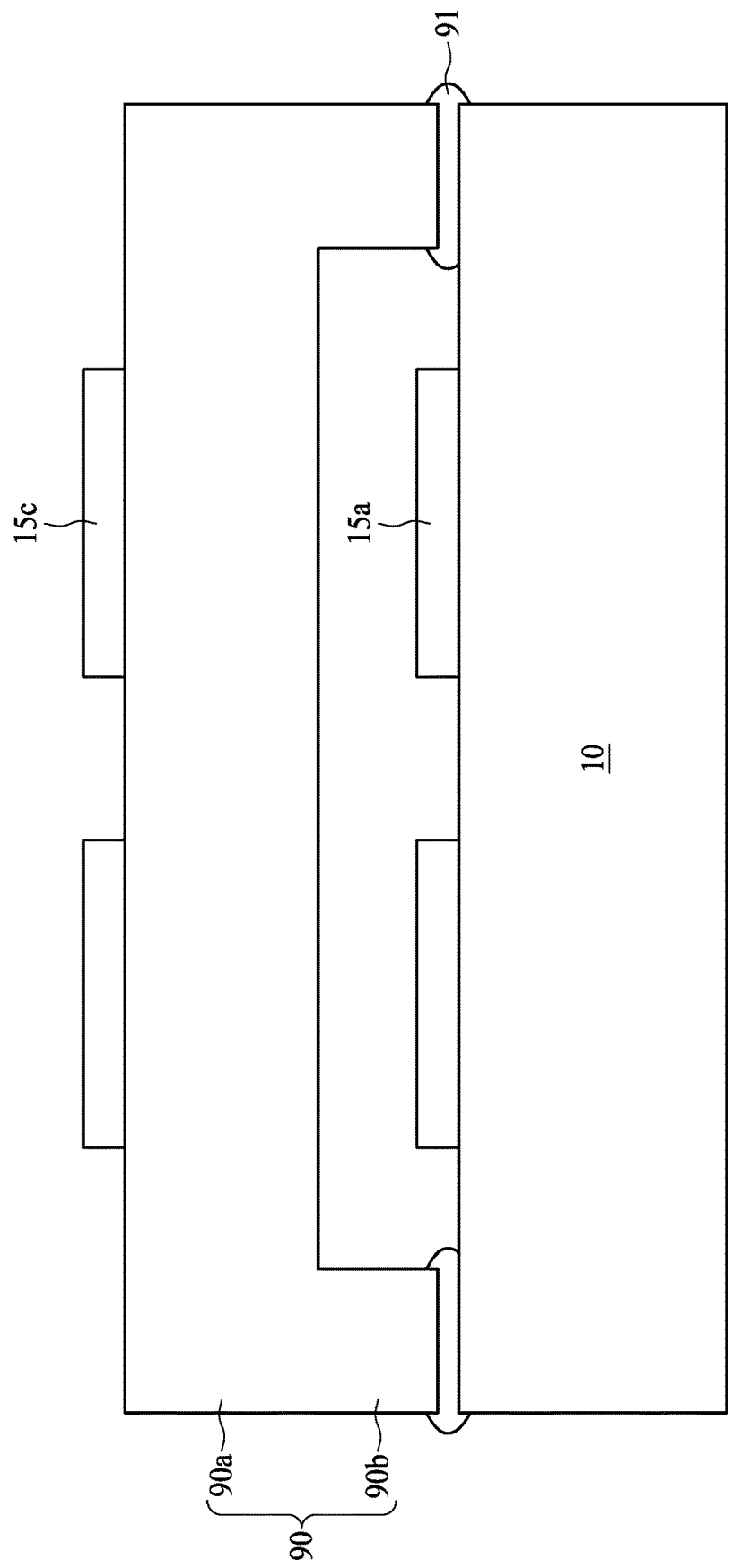
FIG. 9 illustrates a cross-sectional view of a semiconductor package device in accordance with some embodiments of the present disclosure.

FIG. 9 illustrates a semiconductor package device 9 according to some embodiments of the present disclosure. The semiconductor package device 9 includes a substrate 10, an antenna pattern 15a disposed on the substrate 10, a substrate 90 including a base portion 90a and an extension portion 90b protruding downwardly from the base portion 90a and disposed on the substrate 10 to define an air cavity between the substrate 10 and the substrate 90, an adhesive 91 (e.g., an epoxy resin or other resin) to provide adhesion between the substrate 10 and the substrate 90, and an antenna layer 15c disposed on the substrate 90. In some embodiments, the substrate 90 can be formed of, or can include, glass, silicon, or other dielectric material having a low dielectric constant. In some embodiments, a solder can be used in place of, or in conjunction with, the adhesive 91. Advantages of the semiconductor package device 9 include a well-controlled air cavity height, such as where the height of the cavity can be controlled to 250 µm±10 µm (e.g. to 250 µm±8 µm, or 250 µm±6 µm), and a low degree of bleeding of a material of the extension portion 90b to mitigate against contamination of the antenna pattern 15a. In some embodiments, the semiconductor package device 9 further includes an adhesive material formed on the substrate 10 around the extension portion 90b of the substrate 90.

FIG. 10A, FIG. 10B, FIG. 10C and FIG. 10D are cross-sectional views of a semiconductor structure at various stages of fabrication, in accordance with some embodiments of the present disclosure. Various figures have been simplified to provide a better understanding of the aspects of the present disclosure. In some embodiments, the structures shown in FIG. 10A, FIG. 10B, FIG. 10C and FIG. 10D are used to manufacture the semiconductor package device 9 shown in FIG. 9.

Figure 10A:
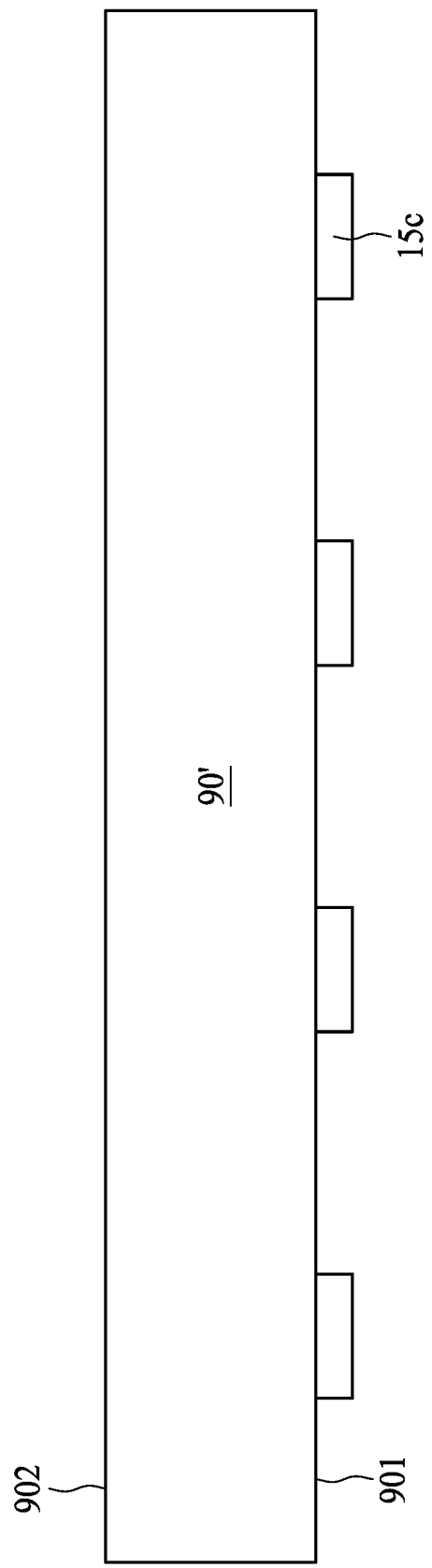
FIG. 10A, FIG. 10B, FIG. 10C and FIG. 10D illustrate a method of manufacturing a semiconductor package device in accordance with some embodiments of the present disclosure.

Referring to FIG. 10A, a substrate 90' is provided and the antenna pattern 15c is formed on a surface 901 of the substrate 90'. In some embodiments, the substrate 90' can be formed of, or can include, glass, silicon, or other material having a low dielectric constant.

Figure 10B:
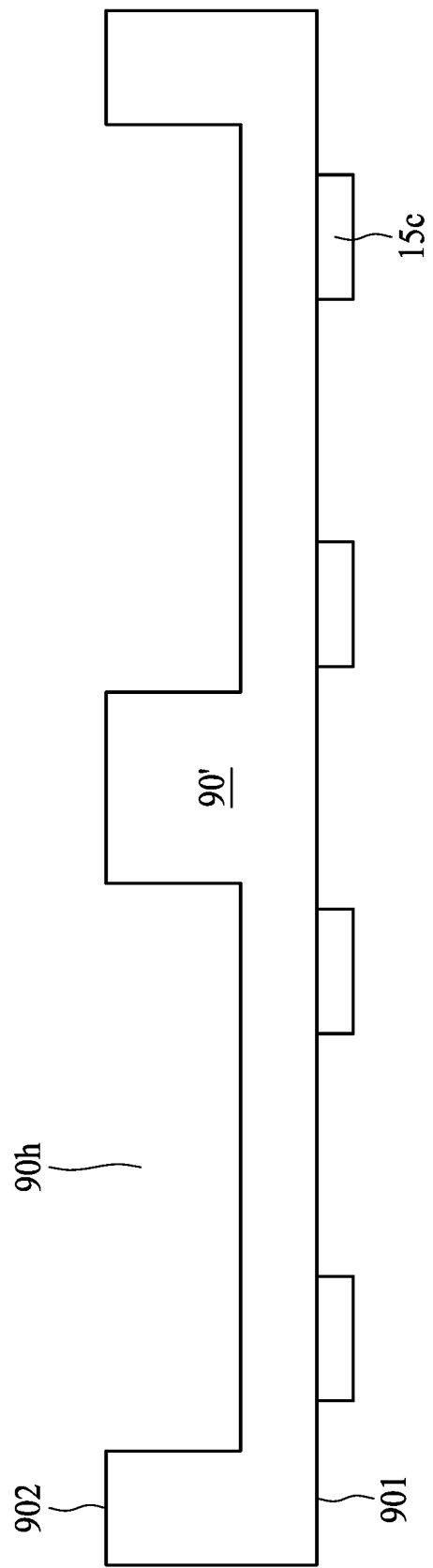

Referring to FIG. 10B, cavities 90h are formed in a surface 902 of the substrate 90' into the substrate 90, such as by etching or other removal processes.

Figure 10C:
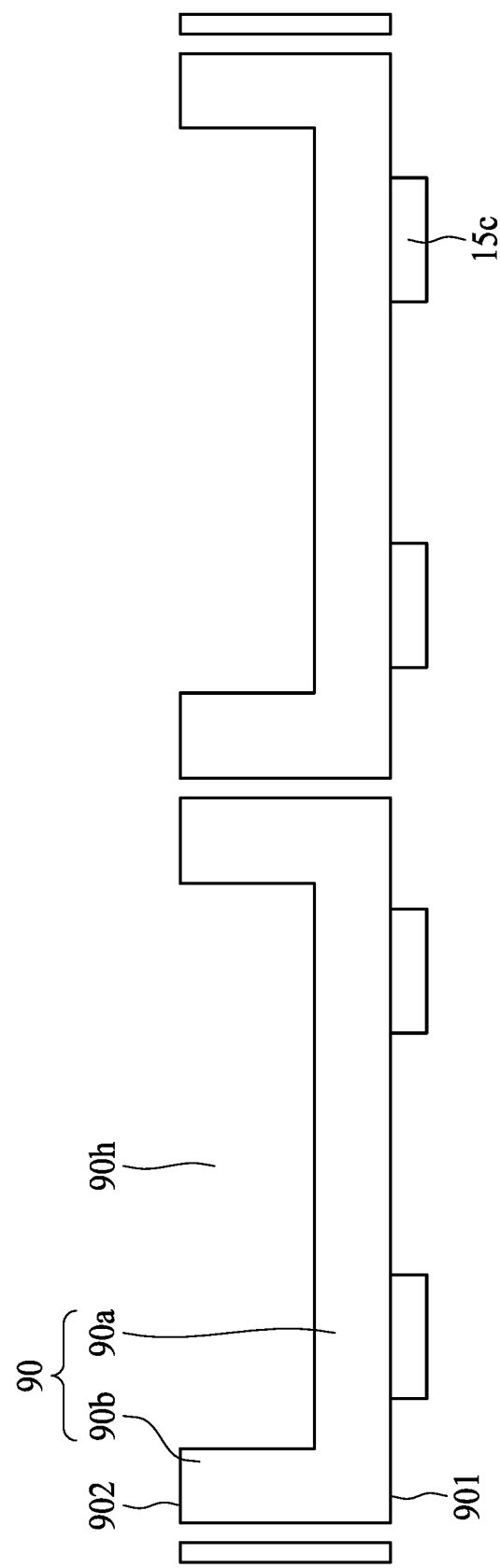

Referring to FIG. 10C, the substrate 90' is singulated to form individual substrates 90 including the base portion 90a and the extension portion 90b.

Figure 10D:
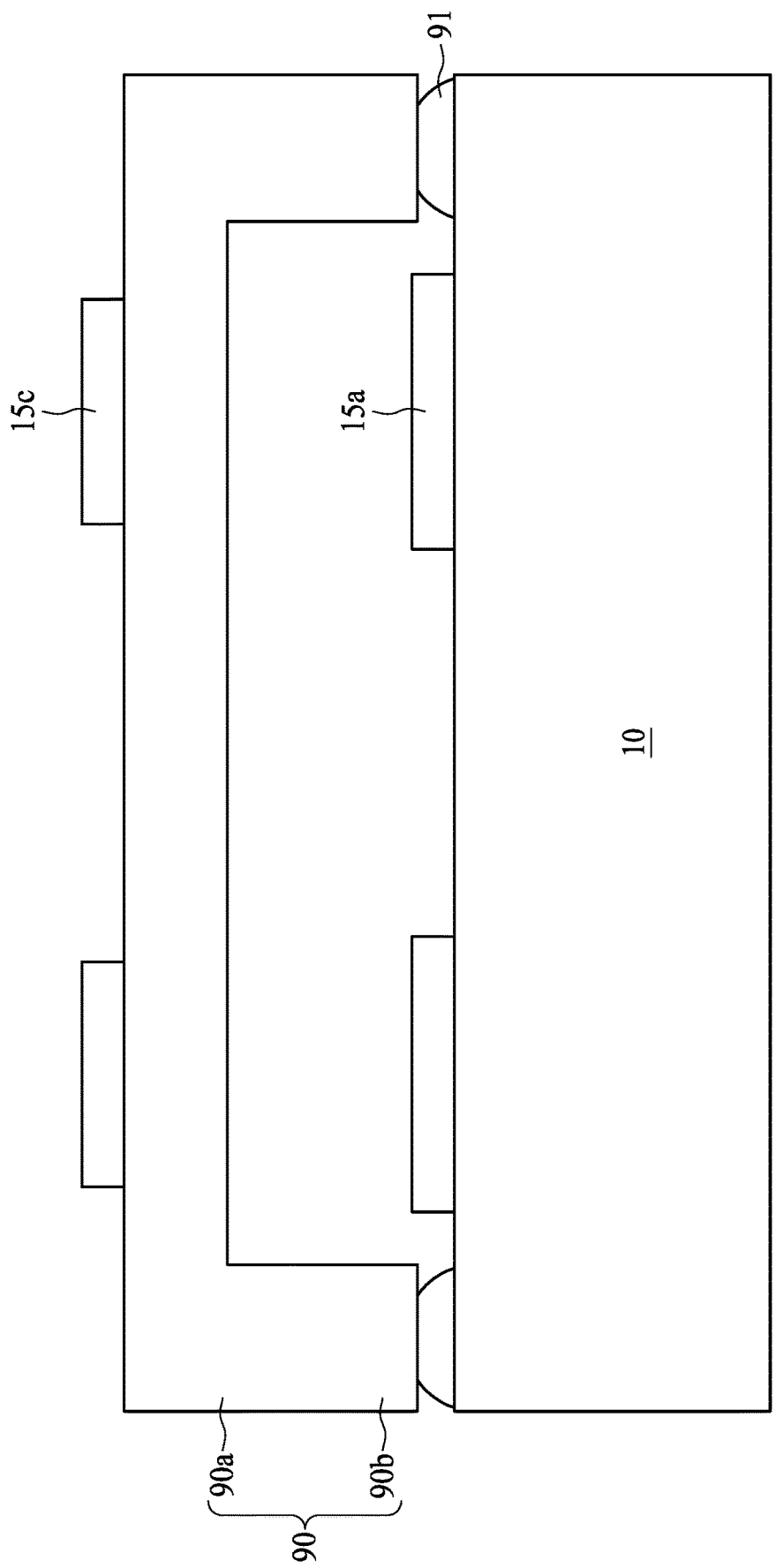

Referring to FIG. 10D, the substrate 10 including the antenna layer 15a formed thereon is provided. The adhesive 91 is disposed on the substrate 10, such as by a printing process or other dispensing process. The substrate 90 formed in the operation shown in FIG. 10C is disposed on the substrate 10 by a pick and place tool. Then the adhesive 91 is cured, such as by applying ultraviolet radiation or heat, to form the semiconductor package device 9 shown in FIG. 9.

As used herein, the terms "approximately," "substantially," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
    a first substrate;
    a second substrate;
    a stand-off structure comprising a spacer and a connection layer, the stand-off structure disposed between the first substrate and the second substrate; and
    an electronic component disposed under the second substrate and electrically connected to an antenna element, wherein the electronic component and the stand-off structure overlap in a cross-sectional view.

2. The semiconductor package device of claim 1, wherein the antenna element is electrically connected to the second substrate.

3. The semiconductor package device of claim 1, wherein the second substrate comprises a first pad, and the spacer and the connection layer are disposed between the first pad and the first substrate.

4. The semiconductor package device of claim 3, wherein the stand-off structure contacts the first pad.

5. The semiconductor package device of claim 3, further comprising an insulating layer disposed between the first substrate and the second substrate, wherein the insulating layer is spaced apart from the spacer.

6. The semiconductor package device of claim 3, wherein the first substrate comprises a second pad, and the stand-off structure is disposed between the first pad and the second pad.

7. The semiconductor package device of claim 6, wherein the stand-off structure contacts the second pad.

8. The semiconductor package device of claim 1, wherein the connection layer covers the spacer.

9. The semiconductor package device of claim 8, wherein a projection of the connection layer on the second substrate overlaps a projection of the spacer on the second substrate.

10. A semiconductor package device, comprising:
    a first substrate comprising a first pad;
    a second substrate disposed over the first substrate;
    a connection layer disposed between the first substrate and the second substrate;
    a first insulating layer in contact with the connection layer and exposing the first pad; and
    a conductive material disposed between the first pad and the second substrate.

11. The semiconductor package device of claim 10, wherein the conductive material comprises a plurality of copper balls.

12. The semiconductor package device of claim 11, wherein the plurality of copper balls comprise at least a first copper ball and a second copper ball both contacting the first pad.

13. The semiconductor package device of claim 11, wherein the second substrate comprises a second pad, the plurality of copper balls comprise at least a first copper ball and a second copper ball, and projections of the first copper ball and the second copper ball are both on the first pad or both on the second pad.

14. The semiconductor package device of claim 11, wherein the plurality of copper balls comprise at least a first copper ball and a second copper ball spaced apart from each other.

15. A semiconductor package device, comprising:
    a first substrate comprising a first pad;
    a second substrate disposed over the first substrate;
    a connection layer disposed between the first pad and the second substrate;
    a first insulating layer disposed over the first substrate and spaced apart from the connection layer; and
    a spacer disposed over the first pad and covered by the connection layer.

16. The semiconductor package device of claim 15, wherein the second substrate comprises a second pad disposed over the first pad, and the connection layer contacts the first pad and the second pad.

17. The semiconductor package device of claim 15, further comprising a second insulating layer disposed between the second substrate and the first insulating layer, wherein the second insulating layer is spaced apart from the connection layer.

* * * * *